United States Patent
Jeng et al.

(10) Patent No.: US 12,550,770 B2
(45) Date of Patent: Feb. 10, 2026

(54) EMBEDDED STRESS ABSORBER IN PACKAGE

(71) Applicant: Taiwan Semiconductor Manufacturing Co., Ltd., Hsinchu (TW)

(72) Inventors: Shin-Puu Jeng, Hsinchu (TW); Chien-Sheng Chen, Hsinchu (TW); Po-Yao Lin, Zhudong Township (TW); Po-Chen Lai, Hsinchu (TW); Shu-Shen Yeh, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/599,734

(22) Filed: Mar. 8, 2024

(65) Prior Publication Data

US 2024/0213213 A1 Jun. 27, 2024

Related U.S. Application Data

(60) Continuation of application No. 17/814,788, filed on Jul. 25, 2022, now Pat. No. 11,955,455, which is a division of application No. 17/149,348, filed on Jan. 14, 2021, now Pat. No. 11,532,593.

(60) Provisional application No. 63/085,222, filed on Sep. 30, 2020.

(51) Int. Cl.
*H01L 23/00* (2006.01)
*H01L 23/31* (2006.01)
*H01L 23/498* (2006.01)
*H01L 25/00* (2006.01)

(52) U.S. Cl.
CPC .......... *H01L 24/81* (2013.01); *H01L 23/3121* (2013.01); *H01L 23/49822* (2013.01); *H01L 24/96* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 9,648,729 B1 | 5/2017 | Wong et al. | |
| 10,666,571 B2* | 5/2020 | Zhou | H04L 67/561 |
| 11,289,454 B2* | 3/2022 | Kim | H01L 25/50 |
| 2014/0038360 A1* | 2/2014 | Wang | H01L 25/0655 |
| | | | 438/113 |
| 2015/0200186 A1 | 7/2015 | Park | |
| 2016/0086902 A1 | 3/2016 | Lu et al. | |
| 2018/0138101 A1 | 5/2018 | Yu et al. | |
| 2021/0111160 A1 | 4/2021 | Kim | |

(Continued)

FOREIGN PATENT DOCUMENTS

| | | |
|---|---|---|
| CN | 104779219 A | 7/2015 |
| CN | 108074872 A | 5/2018 |
| TW | 201729374 A | 8/2017 |

*Primary Examiner* — Long Pham
(74) *Attorney, Agent, or Firm* — Slater Matsil, LLP

(57) ABSTRACT

A method includes bonding a first package component over a second package component. The second package component includes a plurality of dielectric layers, and a plurality of redistribution lines in the plurality of dielectric layers. The method further includes dispensing a stress absorber on the second package component, curing the stress absorber, and forming an encapsulant on the second package component and the stress absorber.

20 Claims, 20 Drawing Sheets

(56) References Cited

U.S. PATENT DOCUMENTS

2021/0132310 A1\* 5/2021 Yu ...................... G02B 6/4246
2021/0407821 A1 12/2021 Kim et al.

\* cited by examiner

EMBEDDED STRESS ABSORBER IN PACKAGE

PRIORITY CLAIM AND CROSS-REFERENCE

This application is a continuation of U.S. patent application Ser. No. 17/814,788, entitled "Embedded Stress Absorber in Package," and filed Jul. 25, 2022, which is a divisional of U.S. patent application Ser. No. 17/149,348, entitled "Embedded Stress Absorber in Package," and filed Jan. 14, 2021, now U.S. Pat. No. 11,532,593, issued Dec. 20, 2022, which claims the benefit of the U.S. Provisional Application No. 63/085,222, filed on Sep. 30, 2020, and entitled "Embedded Corner Damper in Organic Interposer," which applications are hereby incorporated herein by reference.

BACKGROUND

The formation of integrated circuits includes forming integrated circuit devices on semiconductor wafers, and then sawing the semiconductor wafers into device dies. The device dies may be bonded to package components such as interposers, package substrates, printed circuit boards, or the like. To protect the device dies and the bonding structures that bond a device die to a package component, an encapsulant such as a molding compound, an underfill, or the like, may be used to encapsulate the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
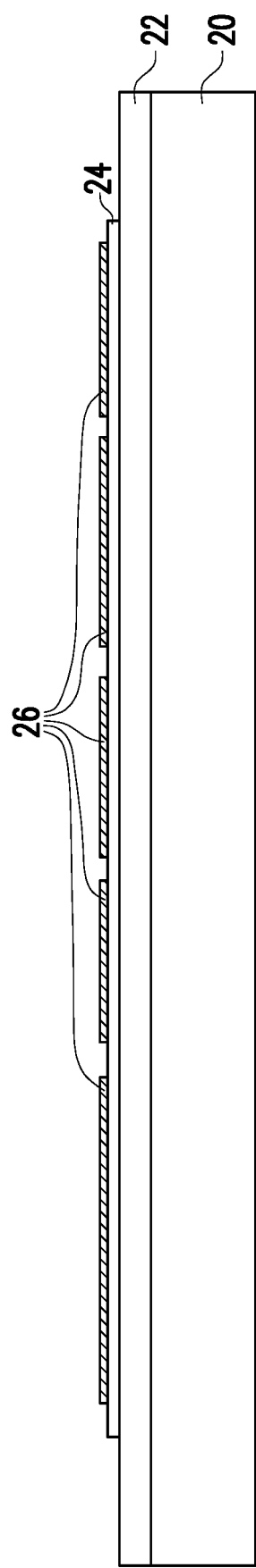
FIGS. 1-9, 10A, 10B, 10C, 11, 12, 13A, and 13B illustrate the cross-sectional views and top views of intermediate stages in the formation of a package including stress absorbers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package with stress absorbers therein and the method of forming the same are provided. In accordance with some embodiments of the present disclosure, a device die is bonded to an underlying package component such as an organic interposer. The device die is molded in an encapsulant such as a molding compound. Stress absorbers are also molded in the encapsulant, and are located close to the corners of the resulting package. The stress absorbers may have a Young's modulus lower than the Young's modulus of the encapsulant, so that it may absorb the stress generated due to the difference between the device die and the underlying package components. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-9, 10A, 10B, 10C, 11, 12, 13A, and 13B illustrate the cross-sectional views and top views of intermediate stages in the formation of a package including embedded stress absorbers in accordance with some embodiments of the present disclosure. The corresponding processes are also reflected schematically in the process flow shown in FIG. 18.

FIGS. 1 through 6 illustrate the cross-sectional views in the formation of package component 46 (FIG. 6) in accordance with some embodiments of the present disclosure. In accordance with some embodiments, package component 46 is an organic interposer, which includes organic dielectric layers and redistribution lines formed in the organic dielectric layers.

In accordance with other embodiments, package component 46 is a semiconductor interposer, which may include a semiconductor (such as silicon) substrate, through-silicon vias in the semiconductor substrate, and metal lines/vias and/or redistribution lines. In accordance with yet alternative embodiments, package component 46 includes a package substrate, which may be a cored substrate or a coreless substrate.

Figure 18:
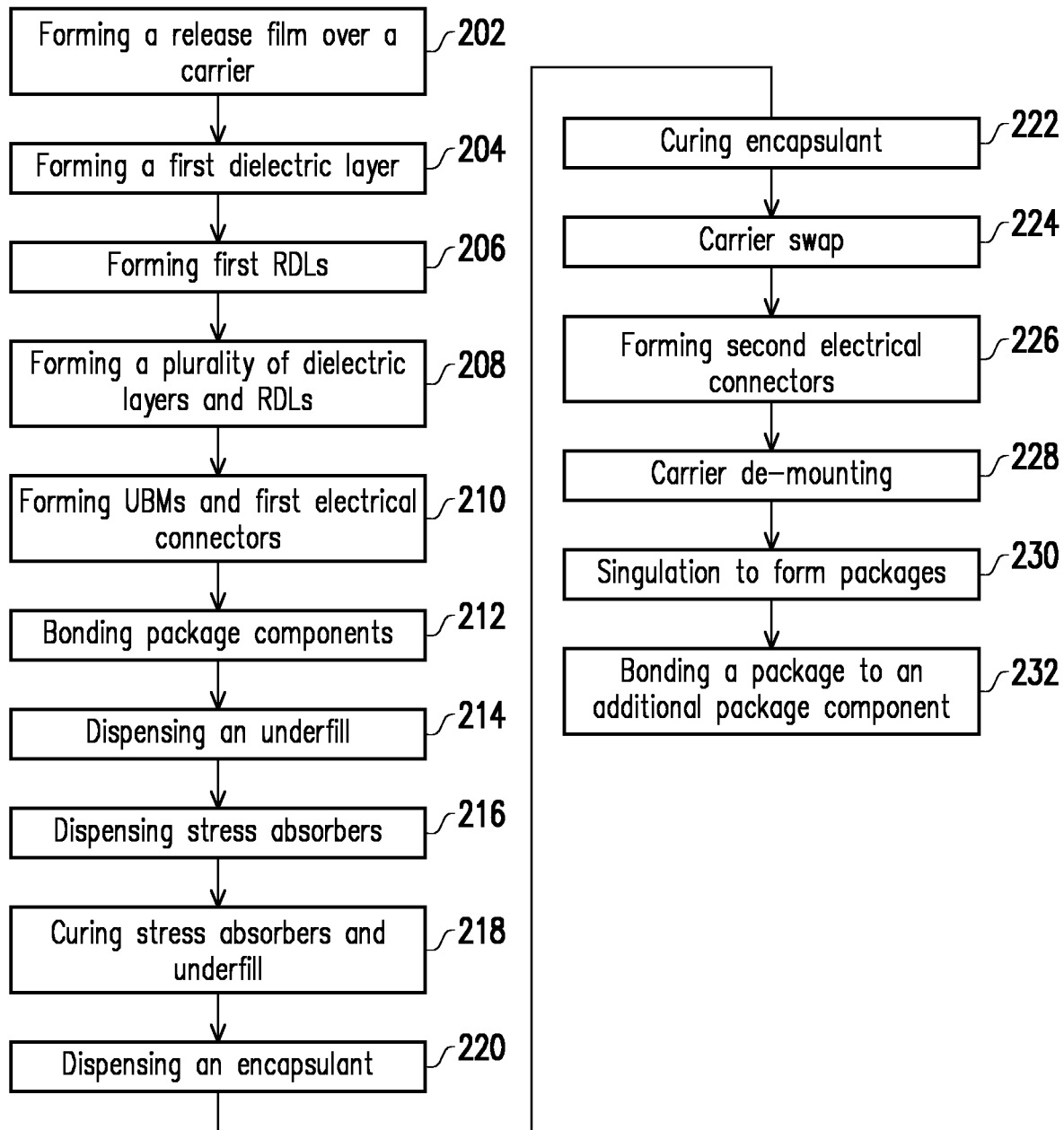
FIG. 18 illustrates a process flow for forming a package in accordance with some embodiments.

Referring to FIG. 1, release film 22 is formed on carrier 20. The respective process is illustrated as process 202 in the process flow 200 as shown in FIG. 18. Carrier 20 may be a glass carrier, an organic carrier, or the like. Carrier 20 may have a round top-view shape, and may have a size of a common silicon wafer. Release film 22 may be formed of a polymer-based material (such as a Light-To-Heat-Conversion (LTHC) material), which may be removed along with carrier 20 from the overlying structures that will be formed in subsequent steps. In accordance with some embodiments of the present disclosure, release film 22 comprises an epoxy-based thermal-release material. Release film 22 may be coated onto carrier 20.

Dielectric layer 24 is formed on release film 22. The respective process is illustrated as process 204 in the process flow 200 as shown in FIG. 18. In accordance with some embodiments of the present disclosure, dielectric layer 24 is formed of or comprises an organic material such as a polymer, which may also be a photo-sensitive material such as polybenzoxazole (PBO), polyimide, benzocyclobutene (BCB), or the like, that may be easily patterned using a photo lithography process. In accordance with alternative embodiments, dielectric layer 24 is formed of or comprises an inorganic dielectric material such as silicon oxide, silicon nitride, silicon oxycarbide, silicon oxynitride, silicon oxy carbo-nitride, or the like.

Redistribution Lines (RDLs) 26 are formed over dielectric layer 24. The respective process is illustrated as process 206 in the process flow 200 as shown in FIG. 18. The formation of RDLs 26 may include forming a seed layer (not shown) over dielectric layer 24, forming a patterned mask (not shown) such as a photo resist over the seed layer, and then performing a plating process on the exposed seed layer. The patterned mask and the portions of the seed layer covered by the patterned mask are then removed, leaving RDLs 26 as shown in FIG. 1. In accordance with some embodiments of the present disclosure, the seed layer includes a titanium layer and a copper layer over the titanium layer. The seed layer may be formed using, for example, Physical Vapor Deposition (PVD). The plating process may be performed using, for example, Electro Chemical Plating (ECP), electro-less plating, or the like.

Figure 2:
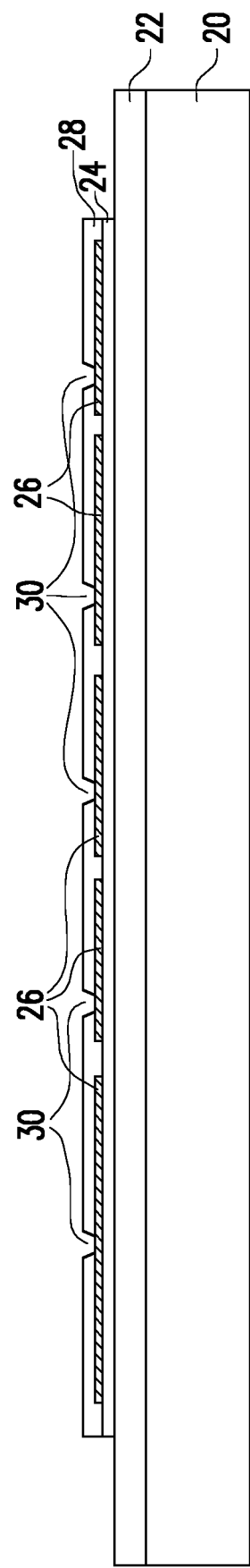

FIGS. 2 through 5 illustrate the formation of a plurality of dielectric layers and a plurality of RDLs. The respective process is illustrated as process 208 in the process flow 200 as shown in FIG. 18. Referring to FIG. 2, dielectric layer 28 is formed on RDLs 26. The bottom surface of dielectric layer 28 is in contact with the top surfaces of RDLs 26 and dielectric layer 24.

In accordance with some embodiments of the present disclosure, dielectric layer 28 is formed of or comprises a polymer, which may be a photo-sensitive material such as PBO, polyimide, BCB, or the like. In accordance with alternative embodiments, dielectric layer 28 is formed of or comprises an inorganic dielectric material, which may be selected from the same group of candidate inorganic materials for forming dielectric layer 24. Dielectric layer 28 is then patterned to form openings 30 therein. Hence, some portions of RDLs 26 are exposed through the openings 30 in dielectric layer 28.

Figure 3:
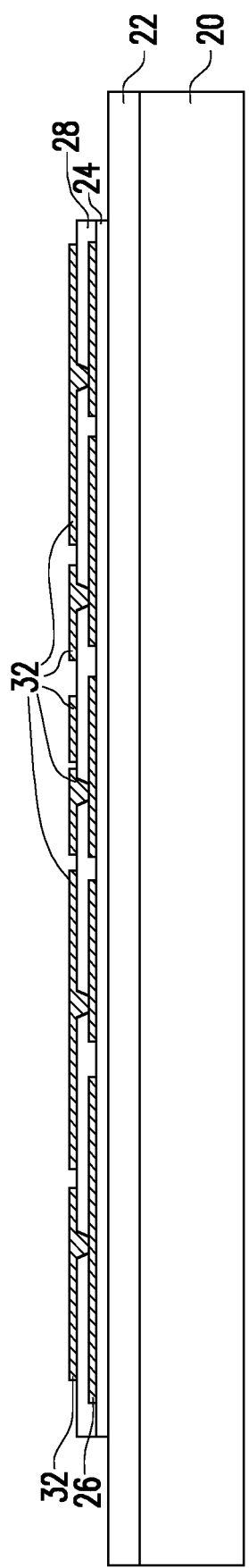

Further referring to FIG. 3, RDLs 32 are formed to connect to RDLs 26. RDLs 32 include metal traces (metal lines) over dielectric layer 28. RDLs 32 also include vias extending into the openings in dielectric layer 28. RDLs 32 are also formed in a plating process, wherein each of RDLs 32 includes a seed layer (not shown) and a plated metallic material over the seed layer. The seed layer and the plated material may be formed of the same material or different materials. RDLs 32 may include a metal or a metal alloy including aluminum, copper, tungsten, and alloys thereof.

Figure 4:
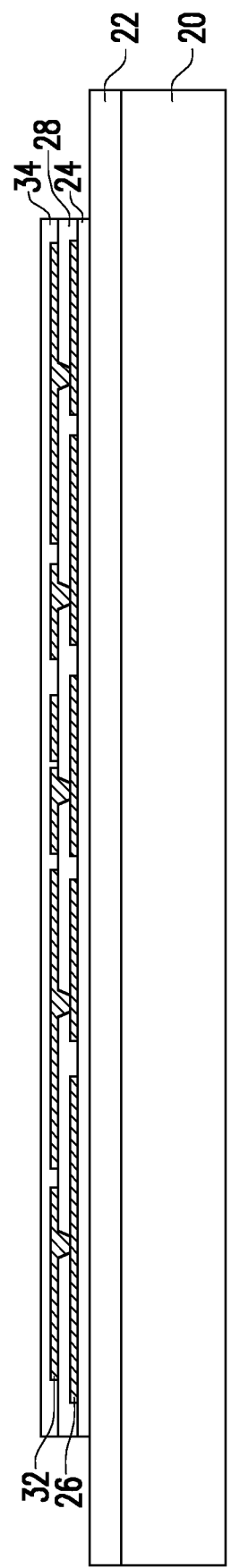

Referring to FIG. 4, dielectric layer 34 is formed over RDLs 32 and dielectric layer 28. Dielectric layer 34 may be formed using an organic material such as a polymer, and may be selected from the same candidate materials as those for forming dielectric layer 28. For example, dielectric layer 34 may be formed of PBO, polyimide, BCB, or the like. Alternatively, dielectric layer 34 may include an inorganic dielectric material such as silicon oxide, silicon nitride, silicon carbide, silicon oxynitride, or the like.

Figure 5:
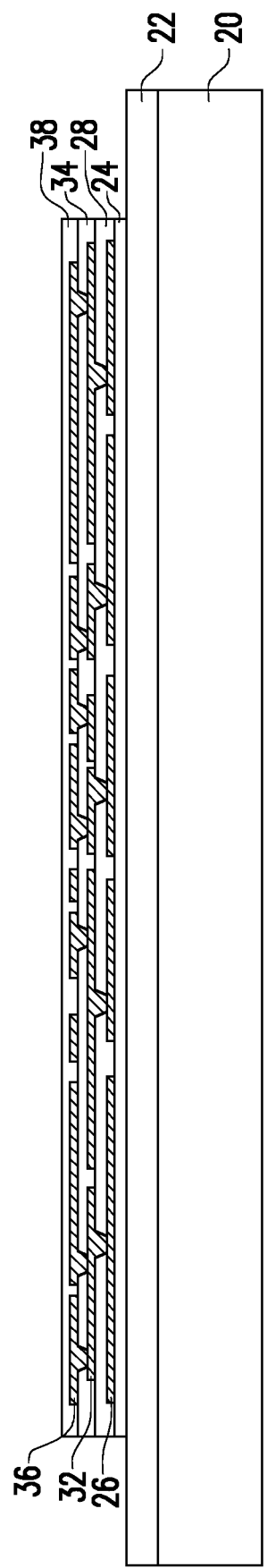

FIG. 5 illustrates the formation of RDLs 36, which are electrically connected to RDLs 32. The formation of RDLs 36 may adopt the methods and materials similar to that of the underlying RDLs 32 and 26. Next, dielectric layer 38 is formed over RDLs 36. It is appreciated that although in the illustrated example embodiments, three layers of RDLs (26, 32, and 36) are illustrated as an example, the package may have any number of RDL layers such as one layer, two layers, or more than three layers, depending on the routing requirement.

In accordance with some embodiments of the present disclosure, dielectric layer 38 is formed of an organic material such as a polymer, which may further be formed of or comprises PBO, polyimide, BCB, or the like. In accordance with alternative embodiments, dielectric layer 38 is formed of an inorganic material such as silicon oxide, silicon nitride, silicon carbide, silicon oxynitride, silicon oxy-carbo-nitride, Un-doped Silicate Glass (USG), or multiplayers thereof.

Figure 6:
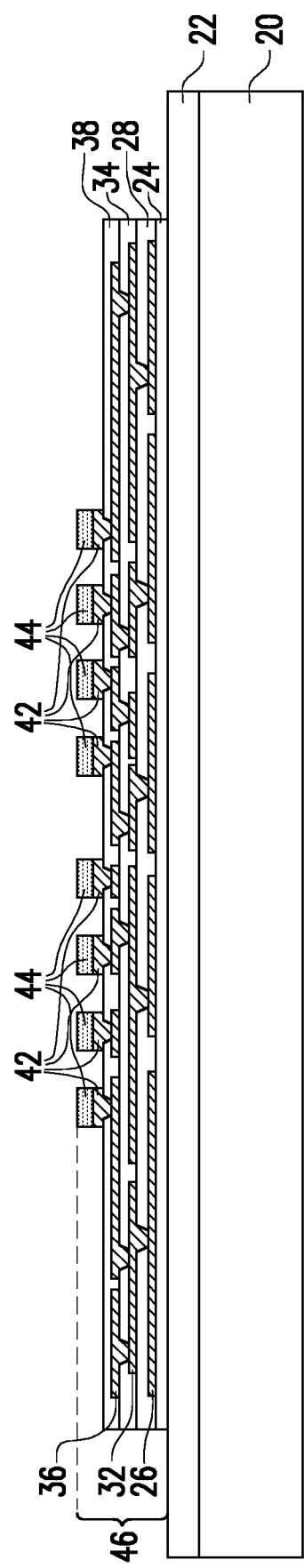

FIG. 6 illustrates the formation of Under-Bump Metallurgies (UBMs) 42 and electrical connectors 44 in accordance with some embodiments. The respective process is illustrated as process 210 in the process flow 200 as shown in FIG. 18. In order to form UBMs 42, openings are formed in dielectric layer 38 to expose the underlying metal pads, which are parts of RDLs 36 in the illustrative example embodiments. In accordance with some embodiment of the present disclosure, UBMs 42 are formed to extend into the openings in dielectric layer 38 and to contact the metal pads in dielectric layer 38. UBMs 42 may be formed of nickel, copper, titanium, or multi-layers thereof. In accordance with some example embodiments, each of UBMs 42 may include a titanium layer and a copper layer over the titanium layer.

Electrical connectors 44 are also formed. The formation of electrical connectors 44 may include placing solder balls on the exposed portions of UBMs 42, and then reflowing the solder balls. In accordance with these embodiments, electrical connectors 44 are solder regions. In accordance with alternative embodiments of the present disclosure, the formation of electrical connectors 44 includes performing a plating process to form solder layers over UBMs 42, and then reflowing the solder layers. Electrical connectors 44 may also include non-solder metal pillars, or metal pillars and solder caps over the non-solder metal pillars, which may also be formed through plating. Throughout the description, the structure including release film 22 and the overlying structure in combination is referred to as package component 46, which may also be referred to as interconnect structure 46. When dielectric layers 24, 28, 34, and 38 are formed of or comprise an organic material(s) such as a polymer(s), package component 46 is also referred to as an organic interposer.

Figure 7:
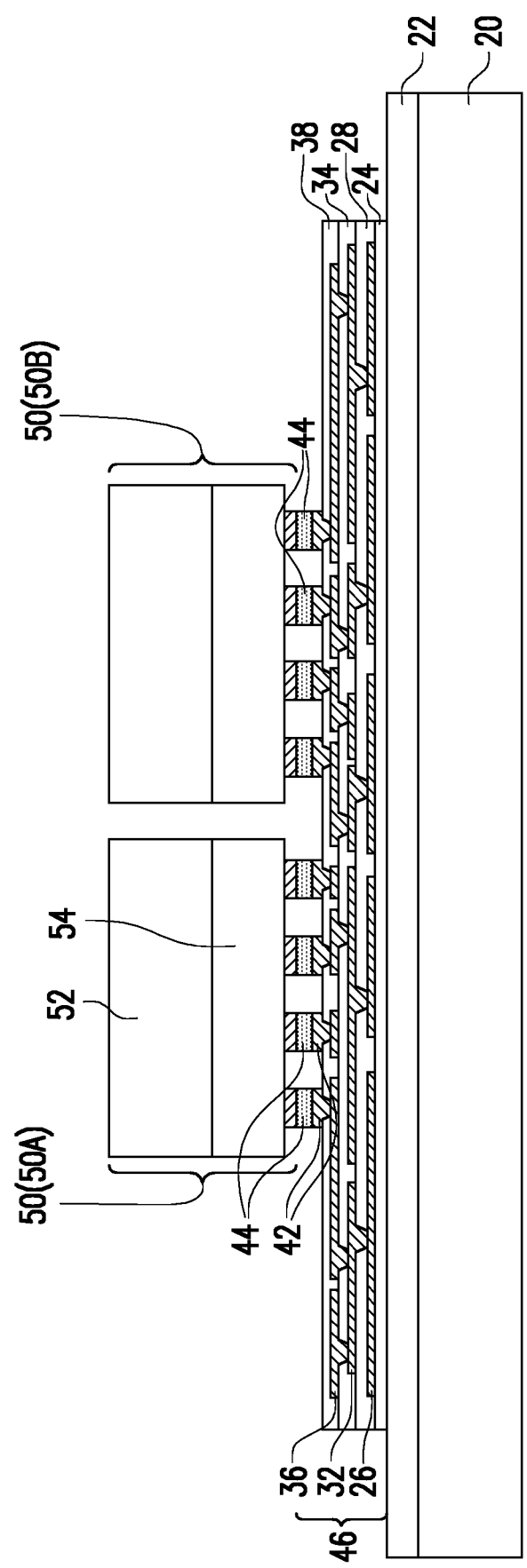
Figure 10A:
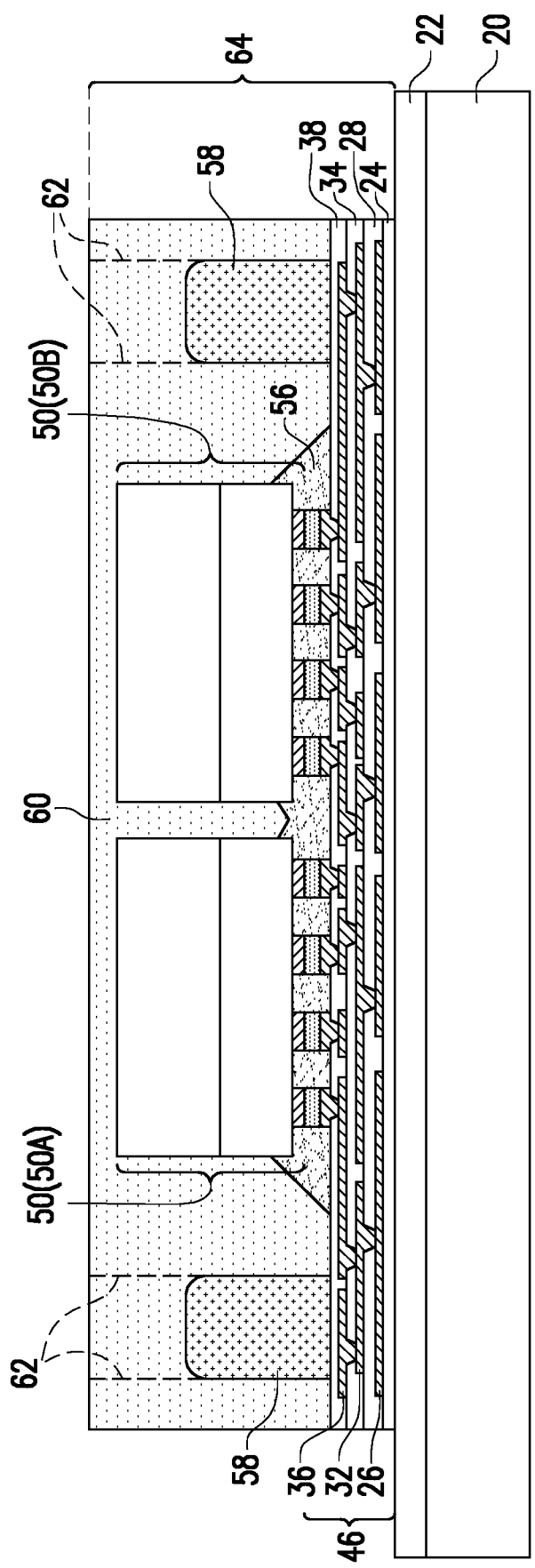
Figure 10B:
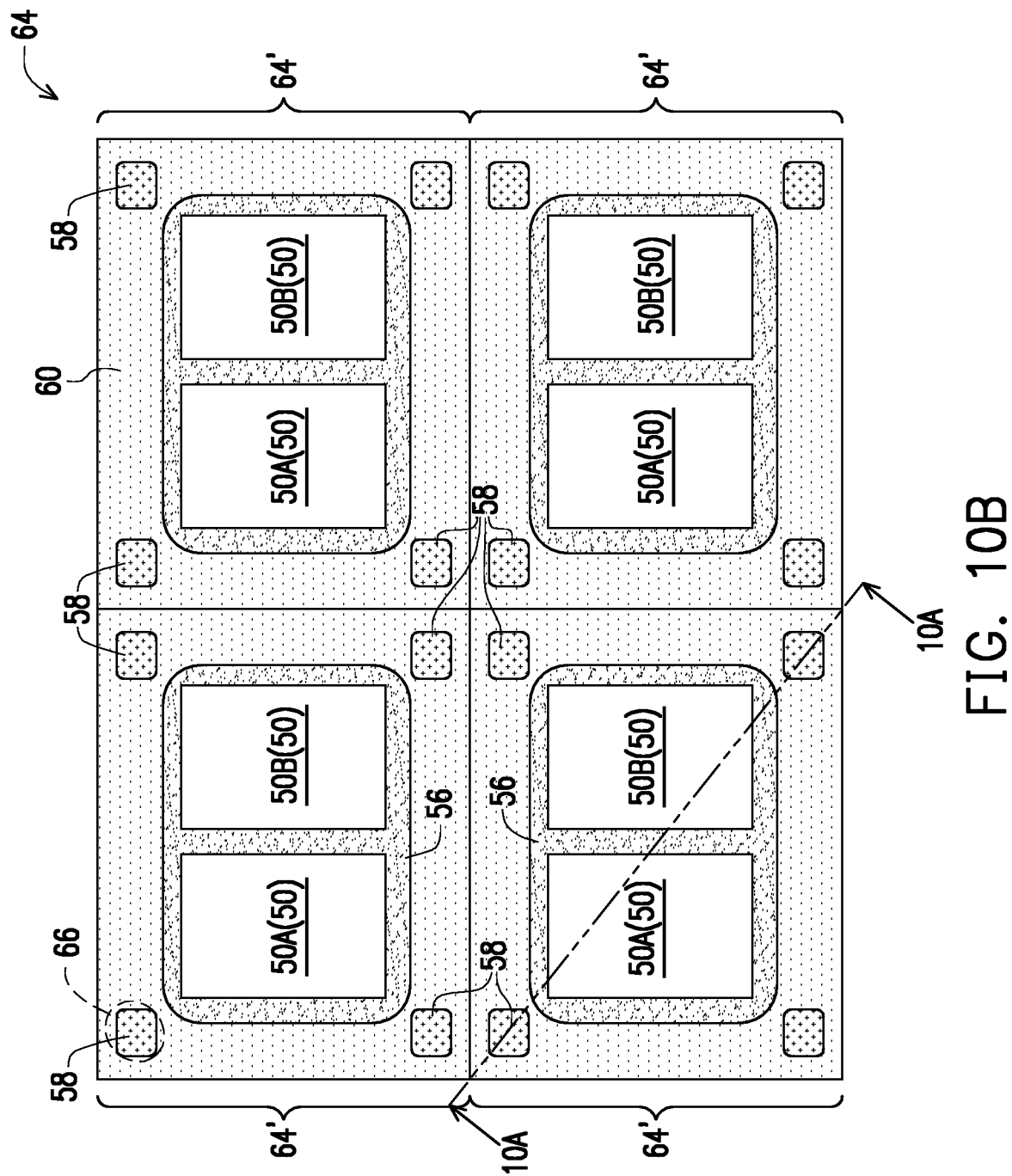
Figure 10C:
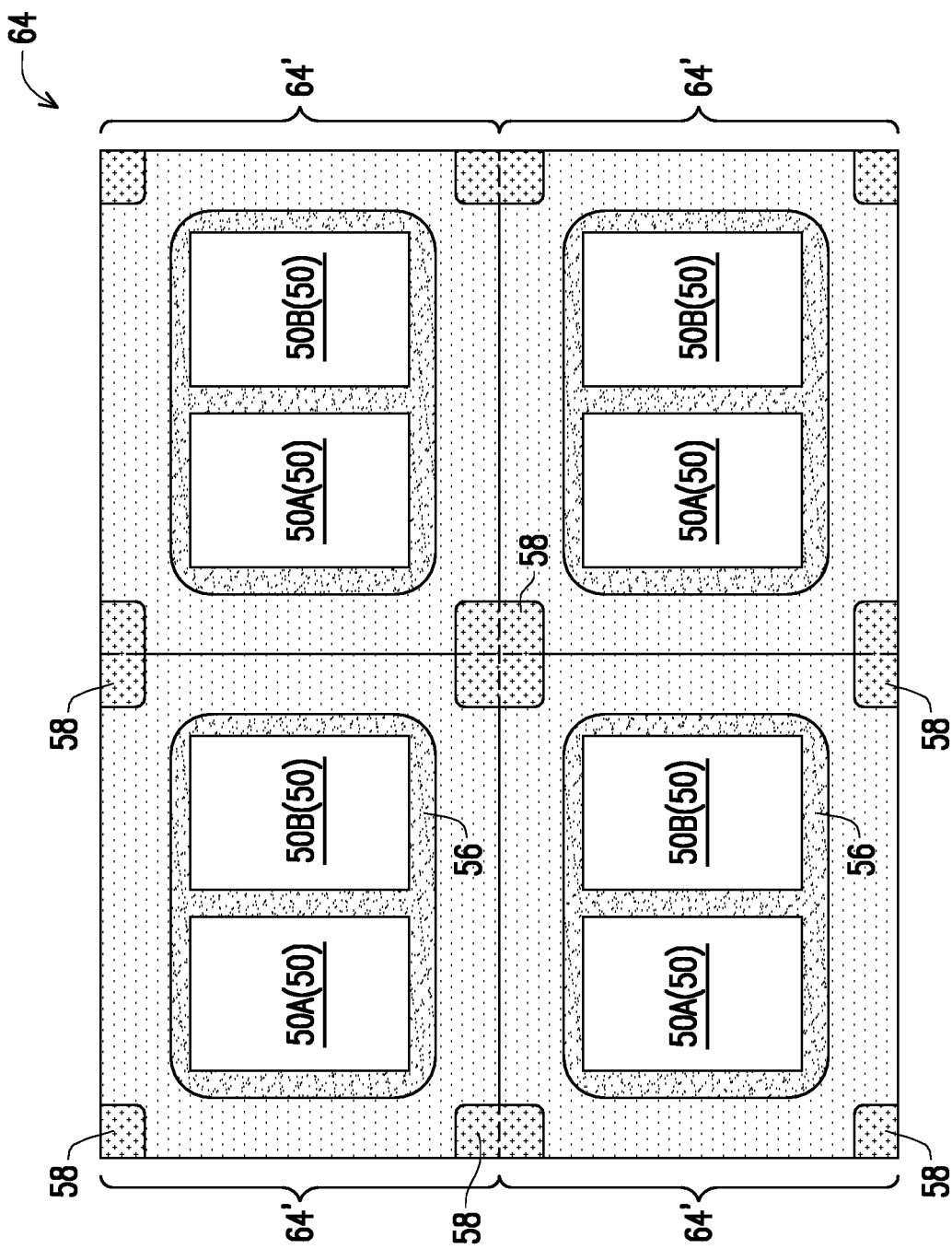

Referring to FIG. 7, package components 50A and 50B are bonded to package component 46. The respective process is illustrated as process 212 in the process flow 200 as shown in FIG. 18. Package components 50A and 50B are individually and collectively referred to as package components 50. The bonding may be achieved through solder bonding, metal-to-metal direct bonding, hybrid bonding (including both of dielectric-to-dielectric bonding and metal-to-metal direct bonding), or the like. Package components 50A and 50B are individually and collectively referred to as package components 50 hereinafter. It is appreciated that while one group of package components 50A and 50B is illustrated, there may be a plurality of groups of package components 50, which groups are identical to each other, bonded to package component 46. Examples of the plurality of groups of package components 50A and 50B are illustrated in FIGS. 10B and 10C. In addition, each group may be a single-component group including a single package component 50, or may include a plurality of (such as two, three, or more) package components 50.

Each of package components 50 may be a device die, a package with a device die(s) packaged therein, a System-on-Chip (SoC) die including a plurality of device dies packaged as a system, or the like. The device dies in package components 50 may be or may comprise logic dies, memory dies, input-output dies, Integrated Passive Devices (IPDs), or the like, or combinations thereof. For example, the logic device dies in package components 50 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 50 may include Static Random-Access Memory (SRAM) dies, Dynamic Random Access Memory (DRAM) dies, or the like. The device dies in package components 50 may include semiconductor substrates and interconnect structures, which are represented by semiconductor substrate 52 and interconnect structure 54, respectively, in FIG. 7 as an example.

Figure 8:
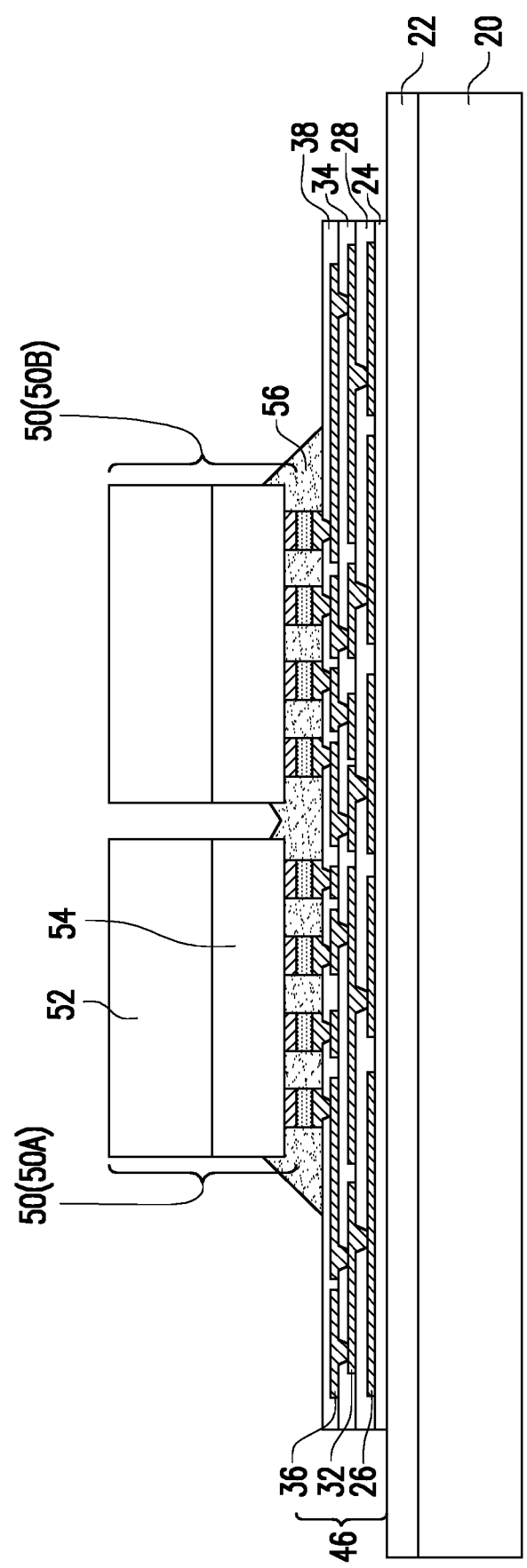

Referring to FIG. 8, underfill 56 is dispensed. The respective process is illustrated as process 214 in the process flow 200 as shown in FIG. 18. In accordance with some embodiments, underfill 56 includes a base material (such as an epoxy) and filler particles in the epoxy, and is flowable. For example, underfill 56 may be dispensed from one side of package components 50, and flows into the gaps between package components 50 and the underlying package component 46, and into the gaps between neighboring package components 50 through capillary.

Figure 9:
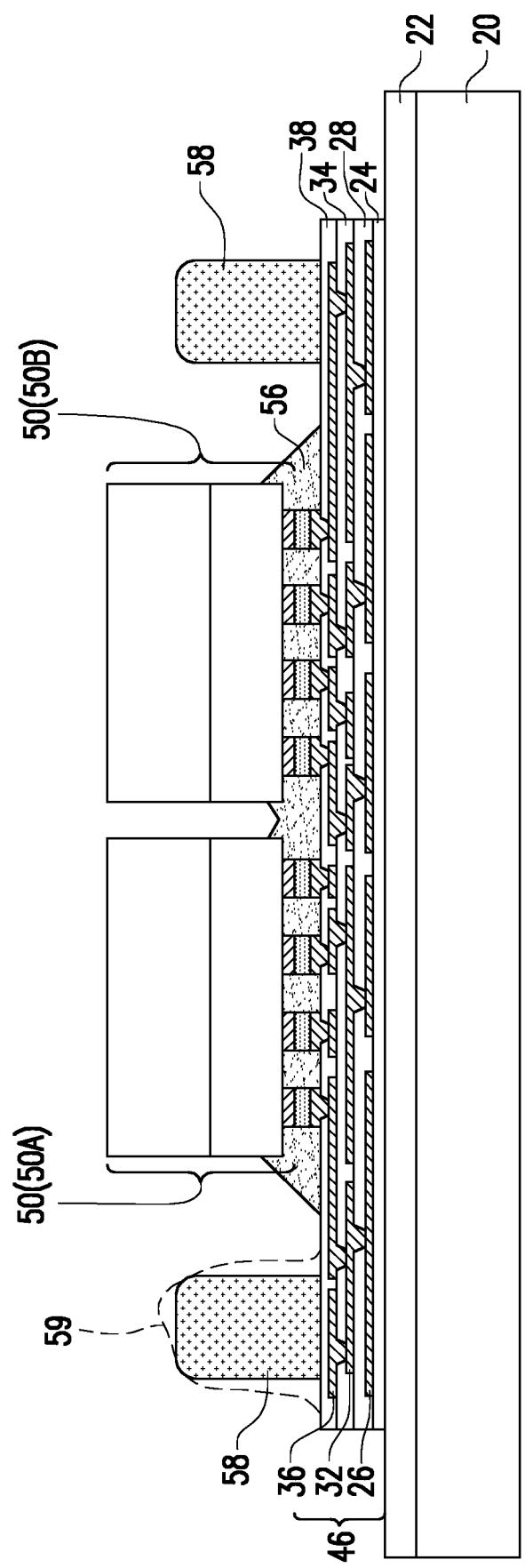

Referring to FIG. 9, stress absorbers 58 are dispensed or attached. The respective process is illustrated as process 216 in the process flow 200 as shown in FIG. 18. In accordance with some embodiments, stress absorbers 58 are flowable, and are dispensed through a dispenser. The viscosity of stress absorbers 58 is high, so that after dispensing, stress absorbers 58 may stand by themselves and maintain their shapes, until they are cured into solid. For example, the viscosity of stress absorbers 58 may be higher than the viscosity of underfill 56. In accordance with some embodiments, stress absorbers 58 include a base flowable material, which may be an epoxy, a resin, a polymer, or the like. The properties of stress absorbers 58 are discussed in subsequent paragraphs. The base flowable material in stress absorbers 58 may be a homogeneous material, with the entirety of stress absorbers 58 being formed of the same material. Some example base materials of stress absorbers 58 may be selected from an epoxy-based resin, for example, Henkel NCA-3280, Namics XS8345D-47, or a silicone-based adhesive such as Shin-Etsu SMC-7030, or the like. These materials have the ability of forming stress absorbers having high aspect ratios and intended shapes. Also, these materials have high moisture resistance. Stress absorbers 58 may (or may not) include other materials in the base flowable material.

Figure 17:
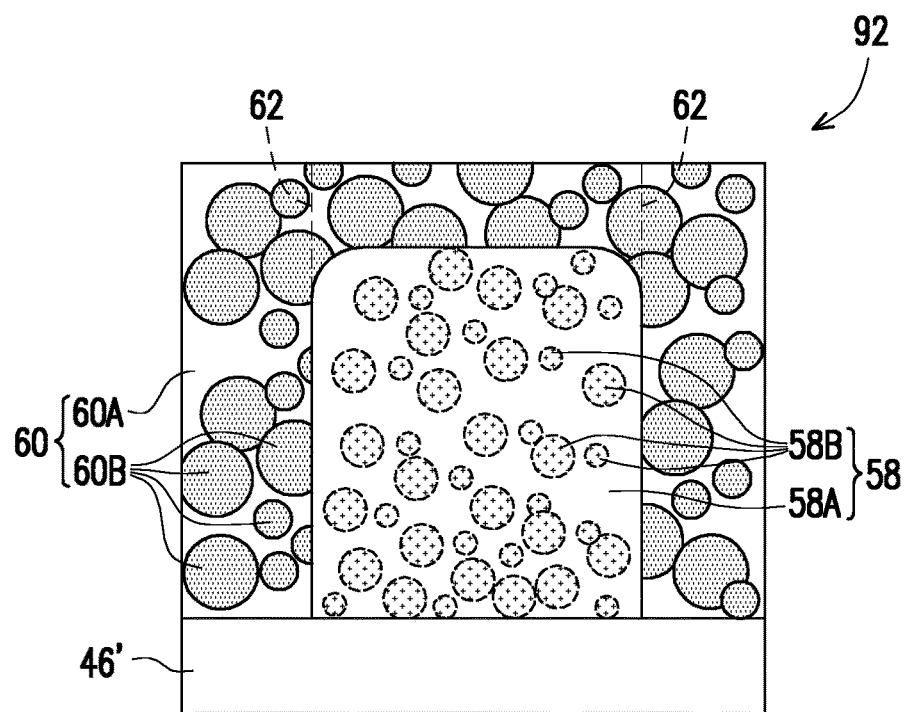
FIG. 17 illustrates an example amplified view of a part of a stress absorber and an encapsulant in accordance with some embodiments.

In accordance with some embodiments, the entirety of stress absorbers 58 is formed of a homogeneous material, for example, the flowable base material. In accordance with other embodiments, as shown in FIG. 17, stress absorbers 58 may include base material 58A and filler particles 58B in base material 58A. Filler particles 58B are used for improving the overall viscosity value of stress absorbers 58. In accordance with some embodiments, filler particles 58B are formed of silica, aluminum oxide, rubber, or the like. In accordance with some embodiments, filler particles 58B are pre-made solid particles, which are mixed with the flowable base material of filler particles 58B.

In accordance with some embodiments in which stress absorbers 58 are flowable, stress absorbers 58 are dispensed using a dispenser. The dispensing may be performed using a stencil to define the shape of stress absorbers 58. Alternatively, stress absorbers 58 are dispensed without using any stencil. When dispensed without using stencil, stress absorbers 58 may have irregular shapes. For example, the sidewalls of stress absorbers 58 may be non-vertical, for example, being slanted and curved. The top surfaces of stress absorbers 58 may also be non-planar, for example, stress absorbers 58 may have curved top surfaces, and may or may not have tips. Dashed lines 59 in FIG. 9 illustrate an example of the sidewalls and top surfaces of stress absorbers 58. Furthermore, when dispensed without using a stencil, the shapes of stress absorbers 58 are random and irregular, and the shapes of stress absorbers 58 may be different from each other. In accordance with alternative embodiments, stress absorbers 58 are pre-made blocks in a solid form, which are attached to the underlying package component 46, for example, through an adhesive film. The pre-made blocks may also be formed of the aforementioned materials, and when these materials involve flowable materials, the flowable materials are cured to form the pre-made blocks.

In accordance with some embodiments, underfill 56 and stress absorbers 58 are cured after the dispensing of stress absorbers 58. The respective process is illustrated as process 218 in the process flow 200 as shown in FIG. 18. Stress absorbers 58 and underfill 56 may be fully cured before the subsequent dispensing of encapsulant 60 (FIG. 10A). Alternatively, stress absorbers 58 may be partially cured, which means stress absorbers 58 become more solid, and their viscosity is increased, but is still not fully solid. For example, when a stencil is used, stress absorbers 58 may be partially cured when they are defined by the stencil, and are fully cured after the stencil is removed. The stress absorbers 58 that are partially cured may be fully cured in the subsequent curing process of encapsulant 60 (FIG. 10A). Curing stress absorbers 58 partially at this stage may reduce the total thermal budget. In addition, during the curing process, stress absorbers 58 may shrink, and the partial curing of stress absorbers 58 allows more shrinking of stress absorbers 58 during the curing of encapsulant 60, which makes stress absorbers 58 less compacted, and may absorb more stress. In accordance with yet alternative embodiments in which stress absorbers 58 have high-enough viscosity, and will not deform during the subsequent dispensing of encapsulant 60, stress absorbers 58 may stay uncured until encapsulant is dispensed, and will be cured together with encapsulant 60.

In accordance with some embodiments as shown in FIGS. 8 and 9, underfill 56 is dispensed before the dispensing of stress absorbers 58. In accordance with alternative embodiments, underfill 56 is dispensed after the dispensing of stress absorbers 58.

Referring to FIG. 10A, package components 50 and stress absorbers 58 are encapsulated in encapsulant 60. The respective process is illustrated as process 220 in the process flow 200 as shown in FIG. 18. Encapsulant 60 fills the gaps between neighboring package components 50 and stress absorbers 58. Furthermore, encapsulant 60 extends throughout the entire carrier 20 to encapsulate the multiple groups of package components 50 (as shown in an example top view as shown in FIGS. 10B and 10C) and the corresponding stress absorbers 58. Encapsulant 60 may be formed of or comprises a molding compound, a molding underfill, an epoxy, and/or a resin. The top surface of encapsulant 60 is higher than the top ends of package components 50 and stress absorbers 58. In accordance with some embodiments, encapsulant 60 may include a base material 58A (FIG. 17), which may be a polymer, a resin, an epoxy, or the like, and filler particles 58B in the base material 58A. The filler particles 58B may include dielectric particles of $SiO_2$, $Al_2O_3$, silica, or the like, and may have spherical shapes. Also, the spherical filler particles may have the same or different diameters.

Next, encapsulant 60 is cured, for example, at a temperature in the range between about 120° C. and about 180° C. The respective process is illustrated as process 222 in the process flow 200 as shown in FIG. 18. In accordance with some embodiments in which stress absorbers 58 are partially cured at the time encapsulant is dispensed, stress absorbers 58 are also cured fully along with encapsulant 60.

After the full curing of stress absorbers 58, encapsulant 60, and underfill 56, a planarization process such as a Chemical Mechanical Polish (CMP) process or a mechanical grinding process is performed to planarize encapsulant 60. After the planarization process, there may be a thin layer of encapsulant 60 covering package components 50. In accordance with alternative embodiments, the top surface(s) of one or more package components 50 in each package component group are exposed. In accordance with some embodiments, after the planarization process, stress absorbers 58 are covered by encapsulant 60, as shown in FIG. 10A. In accordance with alternative embodiments, the portions of encapsulant 60 covering stress absorbers 58 are removed by the planarization process. Accordingly, after the planarization process, the top surfaces of stress absorbers 58 are revealed, and dashed lines 62 illustrate the top portions of corresponding stress absorbers 58. Throughout the description, the features formed over release film 22 are collectively referred to as reconstructed wafer 64.

FIGS. 10B and 10C illustrate the top views of some example reconstructed wafers 64. The cross-sectional view shown in FIG. 10A may be obtained from the reference cross-section 10A-10A in FIG. 10B. FIGS. 10B and 10C illustrate a plurality of packages 64' in reconstructed wafer 64, which reconstructed wafer 64 will be singulated in subsequent processes to separate packages 64' as discrete packages. Packages 64' are identical to each other. Referring to FIG. 10B, in accordance with some embodiments, there are a plurality of stress absorbers 58 dispensed inside each of packages 64'. For example, near each of the corners of a package 64', there is one stress absorber 58. In accordance with some embodiments, absorbers 58 are formed close to, but are spaced apart from, the corners of the respective package 64'. This means that stress absorbers 58 are spaced apart from the edges and the corresponding corners of the respective package 64' by an outer layer of encapsulant 60. Having a layer of encapsulant 60 on the outer sides of stress absorbers 58 (so that stress absorbers 58 are fully embedded in encapsulant 60) may prevent moisture from using stress absorbers 58 as a path to reach locations close to package components 50. Furthermore, simulation results revealed that the regions with highest stress maybe in the regions close to, but not extend to, the corners of packages 64'. For example, FIG. 10B illustrates an example region 66, which is the region with the highest stress and close to one of the corners of packages 64'. Accordingly, by forming stress absorbers 58 in the regions in which the stress is the highest, smaller stress absorbers 58 may be used, while still can achieve good stress-absorption ability.

In accordance with alternative embodiments, as shown in FIG. 10C, stress absorbers 58 are formed at the corners of packages 64', and extend into neighboring packages 64'. For example, as shown in FIG. 10C, each of stress absorbers 58 may extend into four neighboring packages 64'. In these embodiments, each of stress absorbers 58 may be large enough to extend into the regions with the highest stress. These embodiments may be adopted when stress absorbers 58 are moisture resistant, and when their moisture resistance is equal to or higher than the moisture resistance of encapsulant 60.

Figure 11:
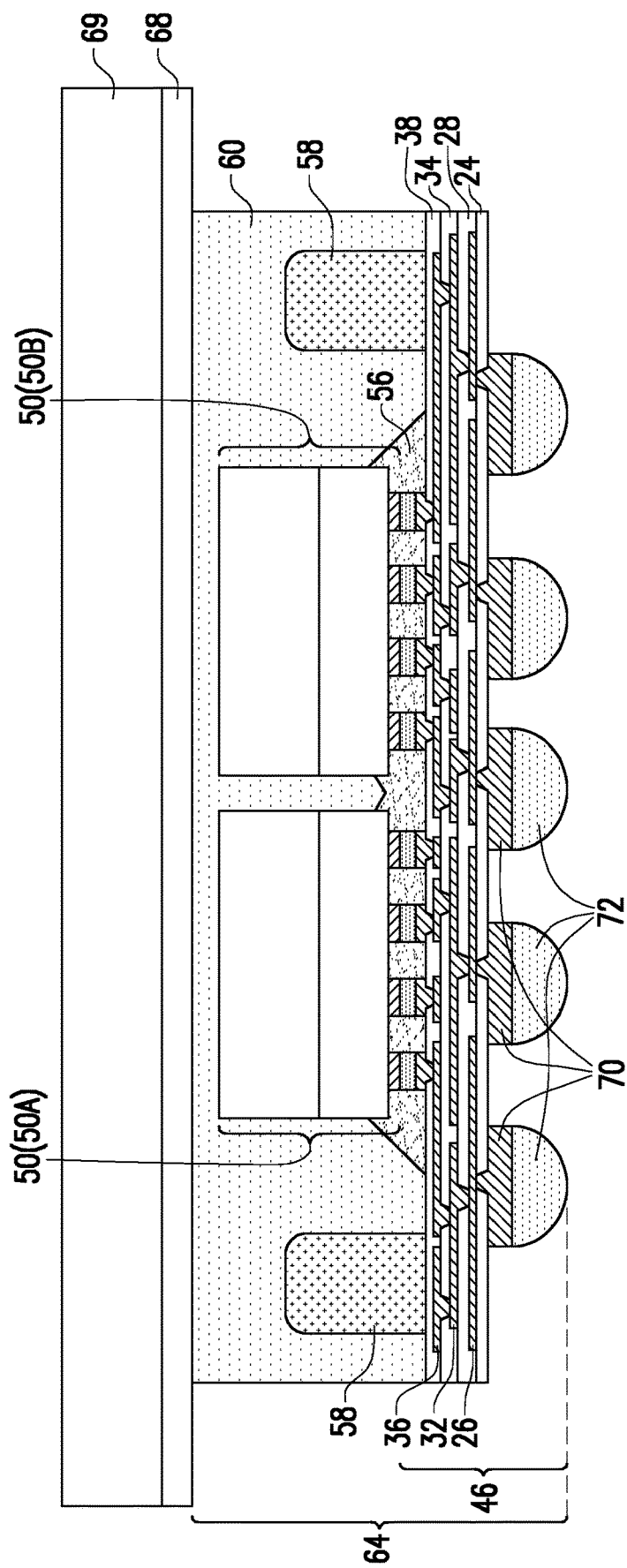

FIG. 11 illustrates the formation of bottom-side electrical connectors on the bottom side of reconstructed wafer 64. First, a carrier swap is performed. The respective process is illustrated as process 224 in the process flow 200 as shown in FIG. 18. In the carrier swap process, the top surface of the reconstructed wafer 64 as shown in FIG. 10A is first adhered to carrier 69 through release film 68. Next, carrier 20 (FIG. 10A) is detached from reconstructed wafer 64. The detaching process may include projecting a light beam (such as a laser beam) on release film 22, and the light beam penetrates through the transparent carrier 20. In the embodiments in which the light beam is a laser beam, the laser beam scans through the entire release film 22. As a result of the light-exposure (such as the laser scanning), release film 22 is decomposed by the heat of the light beam, and carrier 20 may be lifted off from release film 22. The corresponding process is also referred to as the de-bonding of reconstructed wafer 64 from carrier 20. The resulting structure is shown in FIG. 11.

As a result of the de-bonding process, dielectric layer 24 is revealed. Next, UBMs (or metal pads) 70 and electrical connectors 72 are formed. The respective process is illustrated as process 226 in the process flow 200 as shown in FIG. 18. The formation process may include patterning dielectric layer 24 to reveal the conductive pads in RDLs 26, and forming UBMs/pads 70, which extend into the openings in dielectric layer 24. UBMs/pads 70 may be formed of or comprise nickel, copper, titanium, or multi-layers thereof. In accordance with some example embodiments, each of UBMs/pads 70 includes a titanium layer and a copper layer over the titanium layer.

Electrical connectors 72 are then formed. The formation of electrical connectors 72 may include placing solder balls on the exposed portions of UBMs/pads 70, and then reflowing the solder balls, and hence electrical connectors 72 are solder regions. In accordance with alternative embodiments of the present disclosure, the formation of electrical connectors 72 includes performing a plating process to form solder layers over UBMs/pads 70, and then reflowing the solder layers. Electrical connectors 72 may also include non-solder metal pillars, or metal pillars and solder caps over the non-solder metal pillars, which may also be formed through plating.

Figure 12:
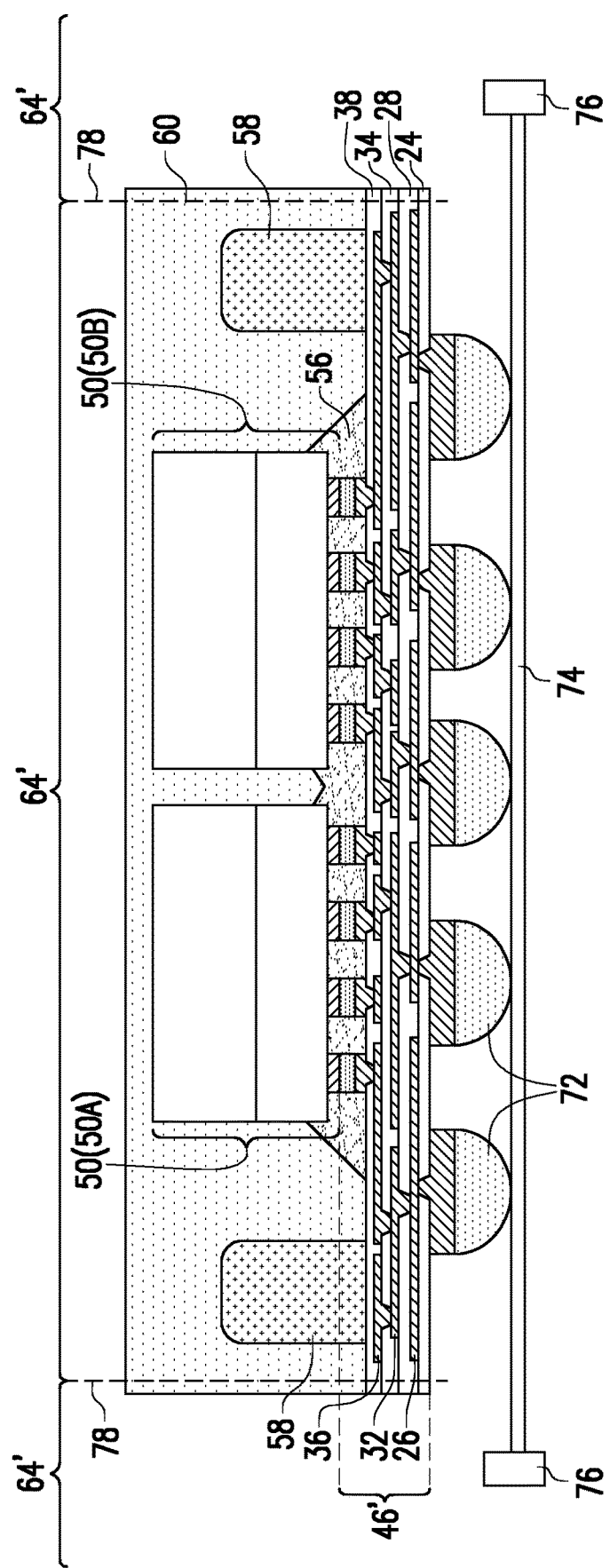

Next, reconstructed wafer 64 is demounted from carrier 69, for example, by projecting a laser beam on release film 68, so that release film 68 is decomposed. The respective process is illustrated as process 228 in the process flow 200 as shown in FIG. 18. Referring to FIG. 12, reconstructed wafer 64 is placed on tape 74, which is supported by frame 76. Reconstructed wafer 64 is then singulated along scribe lines 78, so that reconstructed wafer 64 is separated into discrete packages 64'. The respective process is illustrated as process 230 in the process flow 200 as shown in FIG. 18. Package component (interconnect structure) 46 is also singulated into discrete package component (interconnect structures) 46'.

Figure 13A:
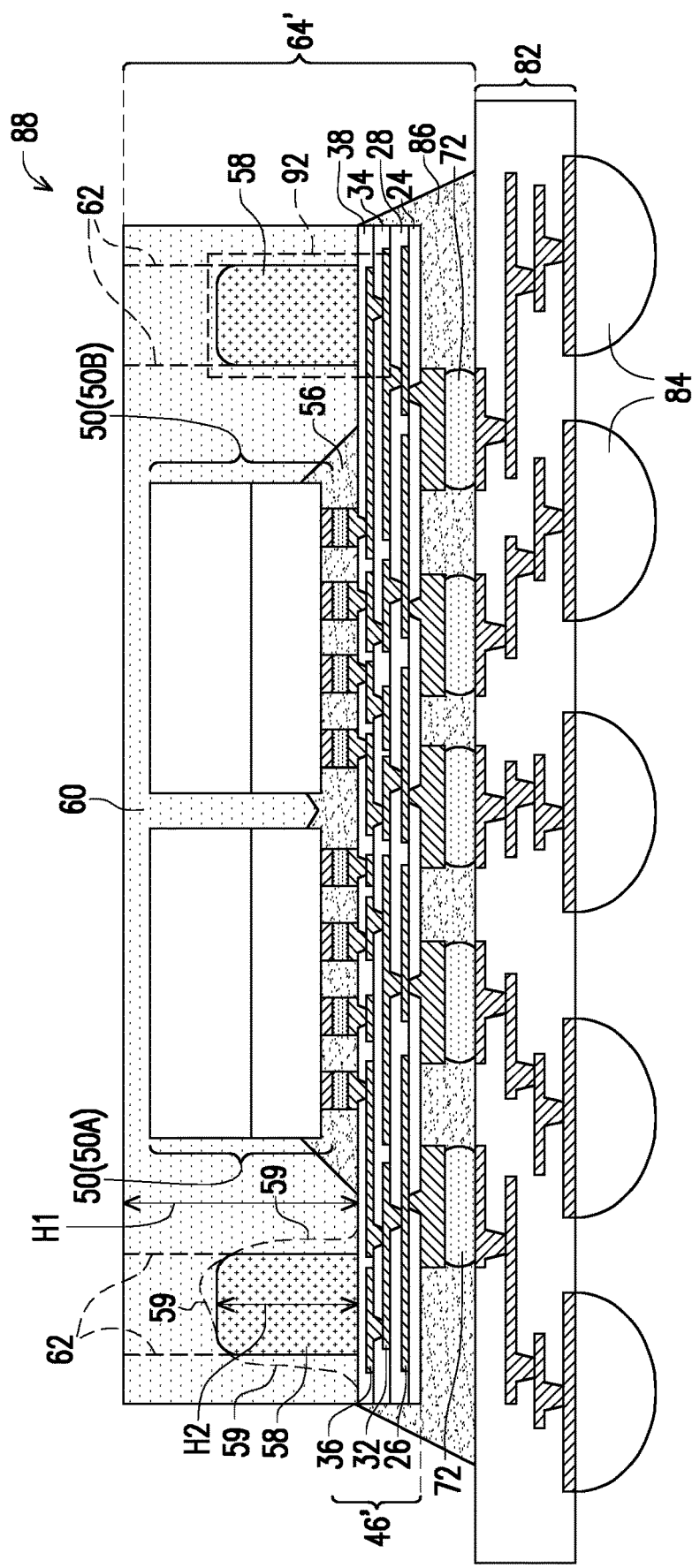

Next, as shown in FIG. 13A, package 64' is bonded with package component 82, for example, through electrical connectors 72, which may include solder regions. The respective process is illustrated as process 232 in the process flow 200 as shown in FIG. 18. In accordance with some embodiments, package component 82 may be or may comprise an interposer, a package, a package substrate, a printed circuit board, or the like. Package component 82 includes electrical connectors 84, which may be solder regions. Underfill 86 may be dispensed into the gap between package 64' and package component 82. Package 88 is thus formed.

In accordance with some embodiments, the Young's modulus of stress absorbers 58 is lower than the Young's modulus of encapsulant 60, which means stress absorbers 58 are softer than encapsulant 60. For example, the Young's modulus of stress absorbers 58 may be smaller than about 10 GPa, and the Young's modulus of encapsulant 60 may be in the range between about 12 GPa and about 25 GPa. Accordingly, when there is stress in encapsulant 60, which stress is generated due to the difference between the Coefficient of Thermal Expansion (CTE) values of package components 50, package component 46', and package component 82, stress absorbers 58 may absorb the stress, and hence the cracking of encapsulant 60 and the delamination between encapsulant 60 and package component 46' are reduced. Furthermore, the difference (YM60-YM58) between the Young's modulus YM60 of encapsulant 60 and the Young's modulus YM58 of stress absorbers 58 may be greater than about 1 GPa, greater than about 2 GPa, or in the range between about 5 GPa and about 10 GPa. Furthermore, ratio (YM60-YM58)/YM60 may be greater than about 0.05, greater than about 0.1, greater than about 0.2, and may be in the range between about 0.05 and about 0.5. When stress absorbers 58 include the base material (such as an epoxy) and fillers, the Young's modulus of the fillers 58B (FIG. 17) may be smaller than the Young's modulus of the base material 58A, so that the filler particles 58B have the function of providing more stress-absorption ability. In accordance with alternative embodiments, the Young's modulus of the fillers 58B may be equal to or higher than the Young's modulus of the base material 58A. The filler size and the filler density in stress absorbers 58 may be smaller than the corresponding filler size and the filler density, respectively, in encapsulant 60.

The CTE value $CTE_{58}$ of stress absorbers 58 may be equal to the CTE value $CTE_{60}$ of encapsulant 60, so that during thermal cycles, stress absorbers 58 will not delaminate from encapsulant 60, and there is no additional stress generated due to the difference between the CTE values of stress absorbers 58 and encapsulant 60. Alternatively, The CTE value $CTE_{58}$ of stress absorbers 58 is slightly different from, and is substantially equal to, the CTE value $CTE_{60}$ of encapsulant 60, for example, with the absolute value of $(CTE_{58}-CTE_{60})/CTE_{60}$ being smaller than about 0.3, smaller than about 0.2, or smaller than about 0.1.

Figure 13B:
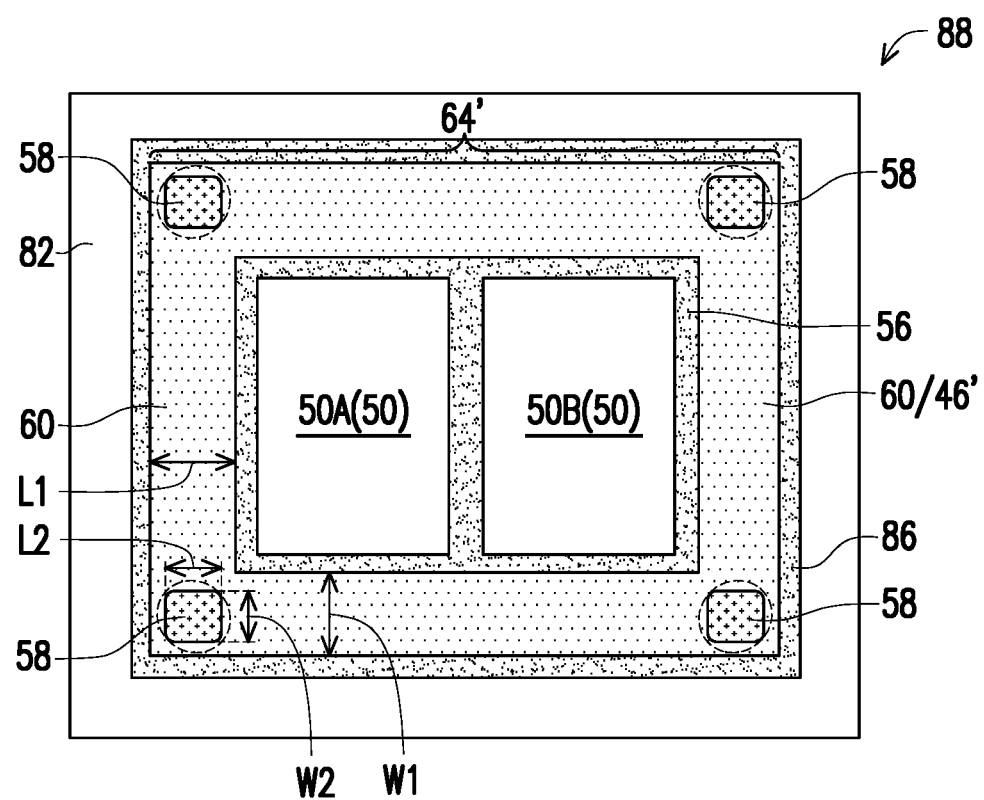

FIG. 13B illustrates a top view of package 88 in accordance with some embodiments. In the illustrated example embodiments, underfill 56 is spaced apart from the edges of package 64' by spacings L1 and W1. In accordance with some embodiments, stress absorbers 58 have length L2 and width W2, with length L2 being smaller than or equal to length L1, and width W2 being smaller than or equal to width W1, so that stress absorbers 58 may be placed on package component 46' without standing on underfill 56. Furthermore, as shown in FIG. 13A, the height H2 of stress absorbers 58 may be smaller than or equal to (as represented by dashed lines 62) the height H1 of encapsulant 60. For example, when stress absorbers 58 is formed of or comprise a material that is prone to moisture penetration, H2 is smaller than H1. Otherwise, height H2 is equal to height H1. Furthermore, the difference (H1-H2) may be greater than about 50 µm, so that the portions of encapsulant 60 on top of stress absorbers 58 may adequately prevent moisture from reaching stress absorbers 58. Otherwise, the moisture that reaches stress absorbers 58 may use stress absorbers 58 as paths to get closer to device dies 50.

Figure 14A:
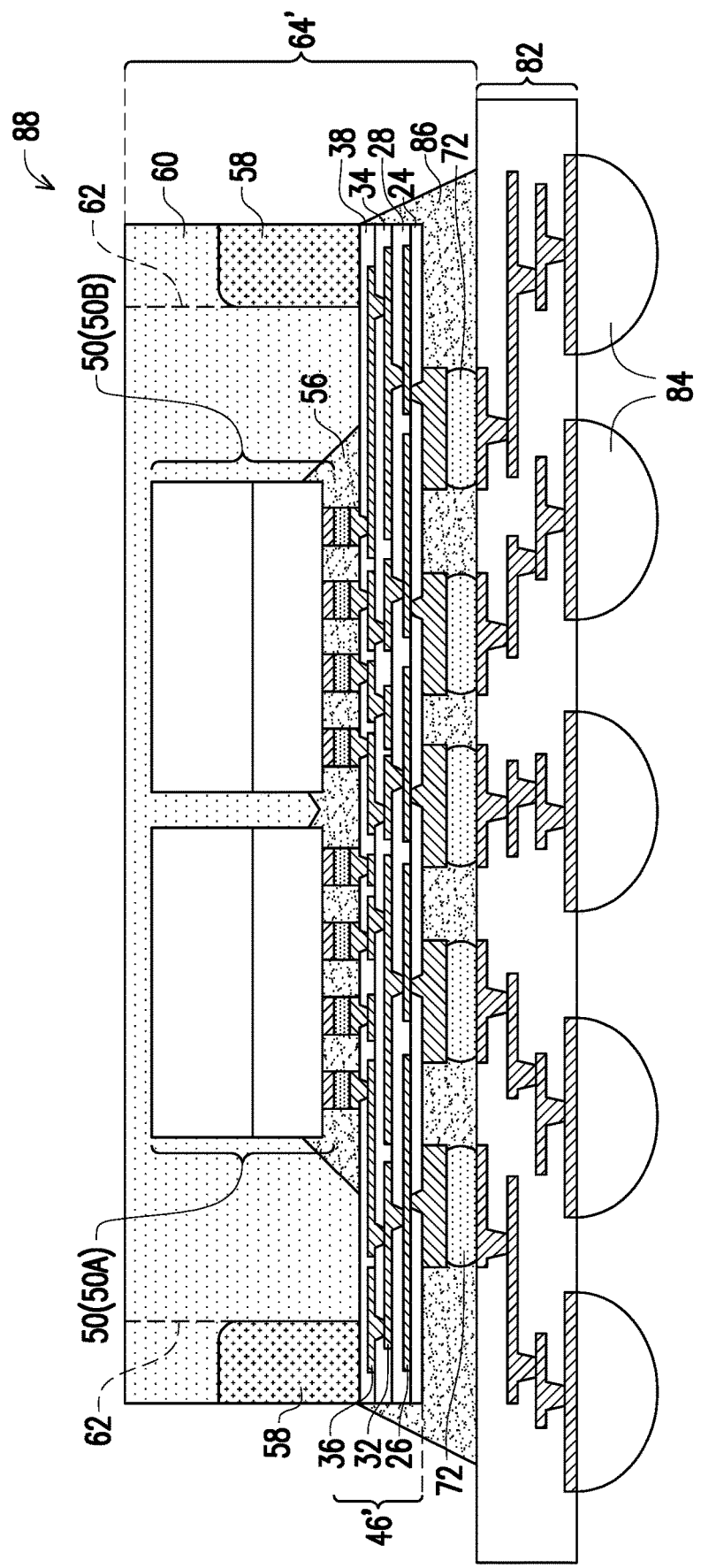
FIGS. 14A and 14B illustrate a top view and a cross-sectional view, respectively, of a package including stress absorbers in accordance with some embodiments.

FIG. 14A illustrates package 88 in accordance with alternative embodiments. The package 88 shown in FIG. 14A is similar to the package 88 in FIG. 13, except that stress absorbers 58 extend to the edges of packages 64'. The embodiments in FIG. 14A may be formed by adopting the reconstructed wafer 64 in FIG. 10C, so that when reconstructed wafer 64 is singulated, each of stress absorbers 58 may be separated into neighboring discrete packages 64'.

Figure 14B:
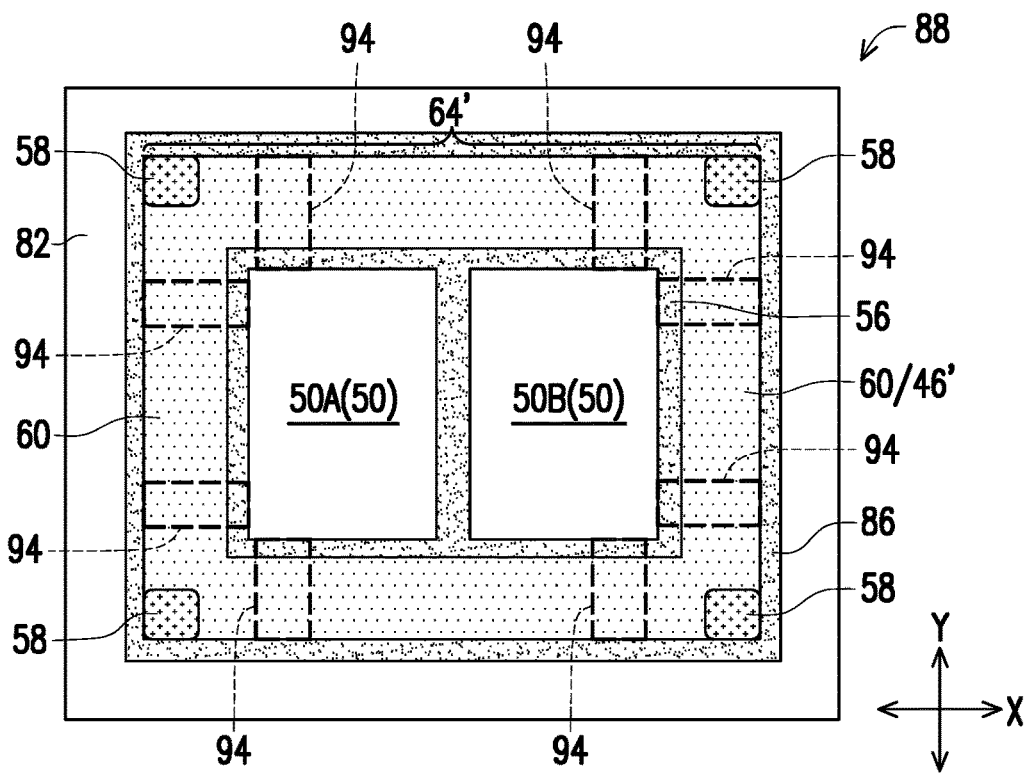

FIG. 14B illustrates a top view of the package 88 as shown in FIG. 14A. Stress absorbers 58 extend to the corresponding edges and the corresponding corners of package 64'.

Each of stress absorbers 58 may include two edges, which are also parts of the edges of package 64'.

Figure 15:
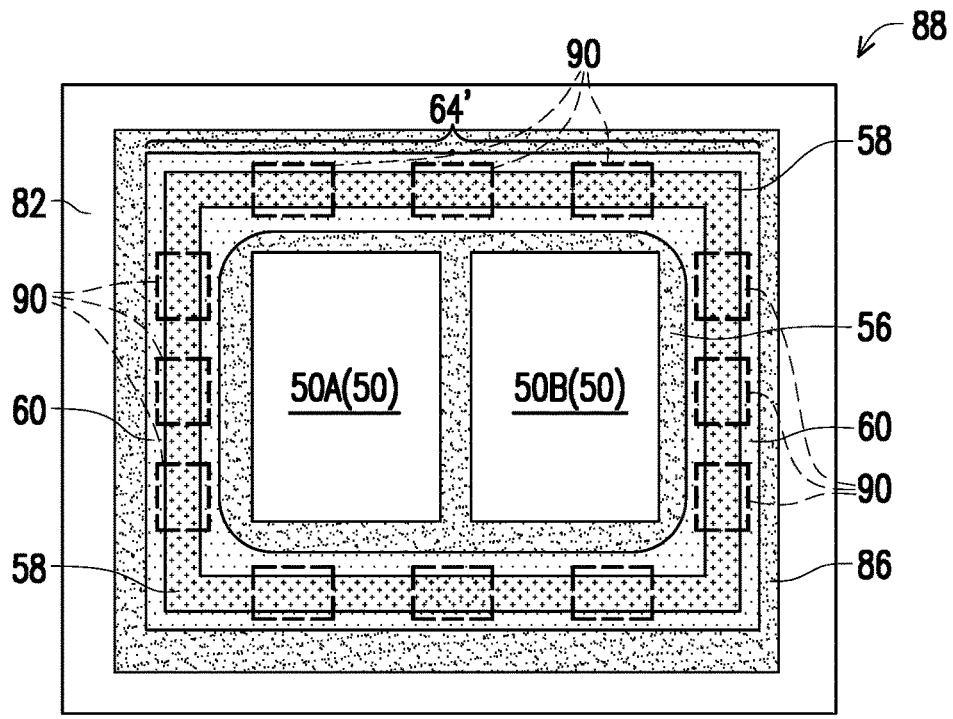
FIGS. 15 and 16 illustrate the top views of stress absorbers in accordance with some embodiments.

FIG. 15 illustrates a top view of package 88 in accordance with alternative embodiments. The cross-sectional view of the corresponding package 88 may also be found referring to FIG. 13A. As shown in FIG. 15, stress absorbers 58 may be aligned to a ring, which includes corner portions close to the corresponding corners of package 64', and edge portions close to and parallel to the corresponding edges of package 64'. In accordance with some embodiments, stress absorber 58 forms a full ring, with no break therein. In accordance with some embodiments, stress absorbers 58 include a plurality of pieces aligned to the ring, but the plurality of pieces are separated from each other. For example, the regions 90 as marked by dashed rectangles may be free from stress absorbers 58 therein.

Figure 16:
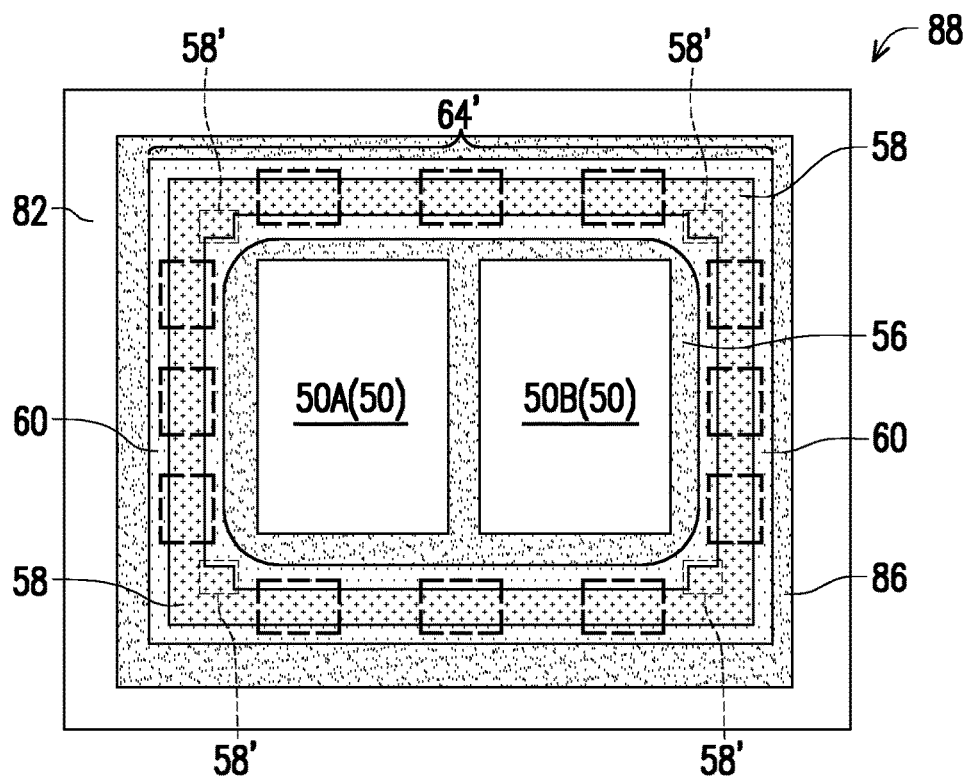

FIG. 16 illustrates a top view of package 88 in accordance with alternative embodiments. The cross-sectional view of the corresponding package 88 may also be found referring to FIG. 13A. The embodiment shown in FIG. 16 is similar to the embodiments shown in FIG. 15, except that inside the stress absorber ring, there are stress absorber extensions 58'. Forming stress absorber extensions 58' may enlarge stress absorber extensions 58' in the corner regions, where stress is the highest. Similar to FIG. 15, in the package 88 as shown in FIG. 16, stress absorbers 58 may be aligned to a ring including corner portions close to the corresponding corners of package 64', and edge portions close to and parallel to the corresponding edges of package 64'. In accordance with some embodiments, stress absorber 58 forms a full ring, with no break therein. In accordance with some embodiments, stress absorbers 58 include a plurality of pieces aligned to the ring, but the plurality of pieces are separated from each other. For example, the regions 90 as marked by dashed rectangles may be free from stress absorbers 58 therein.

FIG. 17 illustrates a magnified view of a portion of example stress absorber 58 and encapsulant 60 in region 92 in FIG. 13A (or FIG. 14A). In accordance with some embodiments, stress absorber 58 includes base material 58A and filler particles 58B in base material 58A. In accordance with alternative embodiments, the material of the entire stress absorber 58 is homogeneous, and no filler particles are included. Accordingly, filler particles 58B are shown as being dashed to indicate they may or may not be formed. Encapsulant may include base material 60A and filler particles 60B in base material 60A. As aforementioned, stress absorber 58 is softer (with smaller Young's modulus) than encapsulant 60. Filler particles 58B may also have a Young's modulus smaller than, equal to, or greater than, the Young's modulus of filler particles 60B.

Experiment results have demonstrated that with the formation of stress absorbers 58, the stress in package 88 is reduced when stress absorbers 58 are placed in selected positions. For example, the experiment results indicated that when the stress absorbers 58 are placed to the positions as shown in FIG. 13B, the stress may be reduced by about 28 percent to about 62 percent, depending on the material and the size of stress absorbers 58. On the other hand, if the stress absorbers 58 are placed, but do not include portions at corners, the stress may increase, rather than decrease. For example, experiment results indicated that if the stress absorbers 58 are placed in regions 94 in FIG. 14B only, the stress may increase by about 34 percent to about 71 percent. This indicates that besides the material of stress absorbers 58, the locations of stress absorbers 58 also affect the results. For example, the stress absorbers 58 having lengthwise direction and width direction parallel to the lengthwise directions and width directions (for example, X-directions and Y-directions as in FIG. 14B), respectively, of the rectangle encircling the package components 50 (and do not overlap with package components 50) has better effect in reducing stress than stress absorbers overlapping package components 50.

The embodiments of the present disclosure have some advantageous features. By selecting proper materials for stress absorbers 58, and forming stress absorbers 58 at proper locations of packages, the stress in the packages may be reduced. The delamination and cracking of encapsulant are also reduced.

In accordance with some embodiments of the present disclosure, a method includes bonding a first package component over a second package component, wherein the second package component comprises a plurality of dielectric layers; and a plurality of redistribution lines in the plurality of dielectric layers; dispensing a stress absorber on the second package component; curing the stress absorber; and forming an encapsulant on the second package component and the stress absorber. In an embodiment, the stress absorber has a first Young's modulus lower than a second Young's modulus of the encapsulant. In an embodiment, the dispensing the stress absorber comprises dispensing a homogeneous material. In an embodiment, the dispensing the stress absorber comprises dispensing a mixed material with a base material and filler particles mixed in the base material. In an embodiment, the filler particles have a first Young's modulus smaller than a second Young's modulus of the base material. In an embodiment, the method further includes performing a singulation process to separate the second package component into a discrete package, wherein in the discrete package, the stress absorber is spaced apart from corresponding nearest edges and nearest corners of the discrete package. In an embodiment, the method further includes performing a singulation process to separate the second package component into a discrete package, wherein the stress absorber is sawed apart in the singulation process. In an embodiment, the method further includes performing a planarization process on the encapsulant, wherein after the planarization process, the stress absorber is covered by a portion of the encapsulant. In an embodiment, the method further includes dispensing an underfill between the first package component and the second package component, wherein the underfill and the stress absorber are cured in a same curing process.

In accordance with some embodiments of the present disclosure, a package includes an interconnect structure comprising a plurality of dielectric layers; and a plurality of redistribution lines in the plurality of dielectric layers; a package component over the interconnect structure, wherein the package component comprises a device die; a stress absorber over the interconnect structure, wherein the stress absorber has a first Young's modulus; and an encapsulant on the package component and the stress absorber, wherein the encapsulant has a second Young's modulus greater than the first Young's modulus. In an embodiment, the stress absorber is in physical contact with the encapsulant. In an embodiment, the stress absorber has a non-vertical and non-straight sidewalls and non-planar top surface. In an embodiment, the stress absorber comprises a base material selected from an epoxy, a resin, or combinations thereof. In an embodiment, the stress absorber further comprises filler particles in the base material. In an embodiment, an entirety of the stress absorber is formed of a homogeneous material.

In accordance with some embodiments of the present disclosure, a package includes a first package component comprising an interconnect structure, which comprises a plurality of dielectric layers; and a plurality of redistribution lines in the plurality of dielectric layers; a second package component over and bonded to the interconnect structure, wherein the second package component comprises a device die; a plurality of stress absorbers over the interconnect structure, wherein the plurality of stress absorbers comprise a corner stress absorber close to a corner of the interconnect structure, and wherein the plurality of stress absorbers comprise a first organic material; and an encapsulant physically contacting at least sidewalls of the corner stress absorber, wherein the encapsulant comprises a second organic material different from the first organic material. In an embodiment, the plurality of stress absorbers have a first Young's modulus, and the encapsulant has a second Young's modulus, and wherein the first Young's modulus is smaller than the second Young's modulus. In an embodiment, the corner stress absorber is spaced apart from edges of the first package component. In an embodiment, the corner stress absorber extends to the corner of the first package component. In an embodiment, the package further includes a third package component underlying and bonding to the first package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
a first package component;

a second package component over and electrically coupling to the first package component, wherein the second package component comprises a device die;
a stress absorber on the first package component, wherein the stress absorber has an irregular cross-sectional view shape comprising an irregularly-shaped top surface and irregularly-shaped sidewalls; and
an encapsulant, with the second package component and the stress absorber being in the encapsulant.

2. The package of claim 1, wherein the irregularly-shaped top surface of the stress absorber is in contact with a bottom surface of the encapsulant to form a non-planar interface.

3. The package of claim 1, wherein the stress absorber comprises a resin.

4. The package of claim 1, wherein the stress absorber comprises a base material and filler particles in the base material.

5. The package of claim 1, wherein the stress absorber is fully encircled by the encapsulant.

6. The package of claim 1, wherein an entirety of the stress absorber is formed of a homogeneous material.

7. The package of claim 1, wherein the stress absorber is softer than the encapsulant.

8. The package of claim 1, wherein the irregularly-shaped top surface of the stress absorber is lower than a top surface of the second package component.

9. The package of claim 1 further comprising a plurality of stress absorbers, with the stress absorber being one of the plurality of stress absorbers, and wherein the plurality of stress absorbers are separated from each other by the encapsulant, and are aligned to a ring encircling the second package component.

10. The package of claim 1 further comprising an underfill, with a portion of the underfill being in a gap between the first package component and the second package component, wherein the stress absorber is spaced apart from the underfill by the encapsulant.

11. A package comprising:
a first package component comprising an interconnect structure, wherein the interconnect structure comprises:
a plurality of dielectric layers; and
a plurality of redistribution lines in the plurality of dielectric layers;
a second package component over and electrically coupling to the interconnect structure, wherein the second package component comprises a device die;
a plurality of stress absorbers over the interconnect structure, wherein the plurality of stress absorbers comprise a first base material and first filler particles in the first base material; and
an encapsulant comprising a second base material and second filler particles in the second base material, wherein the plurality of stress absorbers are in the encapsulant and separated from each other by the encapsulant.

12. The package of claim 11, wherein the plurality of stress absorbers comprise a resin.

13. The package of claim 11, wherein the plurality of stress absorbers comprise a silicone.

14. The package of claim 11, wherein the plurality of stress absorbers have irregular-shaped top surfaces.

15. The package of claim 11, wherein each corner of the first package component is adjacent to one of the plurality of stress absorbers.

16. A package comprising:
an interconnect structure comprising a plurality of redistribution lines therein;
a device die over and joined to the interconnect structure;
an underfill between the device die and the interconnect structure;
a stress absorber over the interconnect structure, wherein the stress absorber comprises a non-vertical sidewall; and
a molding compound in contact with the non-vertical sidewall of the stress absorber to form a distinguishable interface, wherein:
the stress absorber comprises a first base material and first filler particles in the first base material; and
the molding compound comprises a second base material and second filler particles in the second base material.

17. The package of claim 16, wherein the stress absorber has a lower Young's modulus than the molding compound.

18. The package of claim 16, wherein the stress absorber comprises a non-planar top surface contacting a bottom surface of the molding compound to form an interface.

19. The package of claim 16, wherein the stress absorber extends to a corner of the package.

20. The package of claim 11, wherein in a top view of the package, the encapsulant comprises portions that form full rings encircling the plurality of stress absorbers and separating the plurality of stress absorbers from each other.

* * * * *